United States Patent
Gissibl et al.

(10) Patent No.: US 9,093,385 B2
(45) Date of Patent: Jul. 28, 2015

(54) METHOD FOR PROCESSING A SEMICONDUCTOR WORKPIECE WITH METALLIZATION

(71) Applicant: Infineon Technologies AG, Neubiberg (DE)

(72) Inventors: Anja Gissibl, Regensburg (DE); Hermann Wendt, Regensburg (DE); Thomas Fischer, Regensburg (DE); Bernhard Weidgans, Bernhardswald (DE); Gudrun Stranzl, Goedersdorf (AT); Tobias Schmidt, Regensburg (DE); Dietrich Bonart, Bad Abbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 28 days.

(21) Appl. No.: 13/903,013

(22) Filed: May 28, 2013

(65) Prior Publication Data

US 2014/0357055 A1 Dec. 4, 2014

(51) Int. Cl.
- *H01L 21/00* (2006.01)
- *H01L 21/306* (2006.01)
- *H01L 21/3065* (2006.01)
- *H01L 21/78* (2006.01)

(52) U.S. Cl.
CPC ...... *H01L 21/30604* (2013.01); *H01L 21/3065* (2013.01); *H01L 21/78* (2013.01)

(58) Field of Classification Search
None
See application file for complete search history.

(56) References Cited

U.S. PATENT DOCUMENTS

| | | | | |
|---|---|---|---|---|
| 3,633,076 A | * | 1/1972 | Arndt et al. | 257/763 |
| 5,084,415 A | * | 1/1992 | Manocha et al. | 438/654 |
| 5,137,845 A | * | 8/1992 | Lochon et al. | 438/614 |
| 5,420,073 A | * | 5/1995 | DiGiacomo et al. | 216/14 |
| 5,580,668 A | * | 12/1996 | Kellam | 428/610 |
| 7,834,454 B2 | * | 11/2010 | Rinne et al. | 257/737 |
| 2010/0078772 A1 | * | 4/2010 | Robinson | 257/621 |

* cited by examiner

*Primary Examiner* — Scott B Geyer (57) ABSTRACT

A method for processing a semiconductor workpiece is provided, which may include: providing a semiconductor workpiece including a metallization layer stack disposed at a side of the semiconductor workpiece, the metallization layer stack including at least a first layer and a second layer disposed over the first layer, wherein the first layer contains a first material and the second layer contains a second material that is different from the first material; patterning the metallization layer stack, wherein patterning the metallization layer stack includes wet etching the first layer and the second layer by means of an etching solution that has at least substantially the same etching rate for the first material and the second material.

26 Claims, 3 Drawing Sheets

METHOD FOR PROCESSING A SEMICONDUCTOR WORKPIECE WITH METALLIZATION

TECHNICAL FIELD

Various embodiments relate to a method for processing a semiconductor workpiece.

BACKGROUND

Integrated circuits or chips may be electrically connected to and/or from the outside via one or more metallizations disposed at a front side and/or back side of the chip. Forming a metallization may require patterning a metallization layer or layer stack previously deposited over a wafer. Reliable methods to pattern the metallization layer or layer stack may be desirable.

SUMMARY

A method for processing a semiconductor workpiece in accordance with one or more embodiments may include: providing a semiconductor workpiece including a metallization layer stack disposed at a side of the semiconductor workpiece, the metallization layer stack including at least a first layer and a second layer disposed over the first layer, wherein the first layer contains a first material and the second layer contains a second material that is different from the first material; patterning the metallization layer stack, wherein patterning the metallization layer stack includes wet etching the first layer and the second layer by means of an etching solution that has at least substantially the same etching rate for the first material and the second material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, etc.

The term "a plurality" may be understood to include any integer number greater than or equal to two, i.e. two, three, four, five, etc.

The word "over", used herein to describe forming a feature, e.g. a layer, "over" a side or surface, may be used to mean that the feature, e.g. the layer, may be formed "directly on", e.g. in direct contact with, the implied side or surface. The word "over", used herein to describe forming a feature, e.g. a layer, "over" a side or surface, may be used to mean that the feature, e.g. the layer, may be formed "indirectly on" the implied side or surface with one or more additional layers being arranged between the implied side or surface and the formed layer.

The term "connection" may include both an indirect "connection" and a direct "connection".

Singulated chips (in other words, chips obtained from dicing a semiconductor workpiece such as a wafer) may be attached or connected to a lead frame during a die-attach process by means of, for example, adhesive bonding (e.g. gluing) or soldering. Soldering may require a solderable chip back side, which may include or consist of a metallization layer or layer stack, e.g. a Ti/NiV/Ag stack (that is, a layer stack including a titanium (Ti) layer, a nickel-vanadium (NiV) layer and a silver (Ag) layer), wherein Ti may serve as a diffusion barrier and adhesion layer, NiV may serve as a solder interface, and Ag may serve as a solder interface or protection layer. These layers may be deposited to cover the entire surface of a wafer, for example by means of sputtering, and have not been patterned so far. The use of these layers as a solderable front side metallization may currently be limited due to the required patterning of the entire-surface-covering layers.

A conventional process for patterning a front side metallization, e.g. a Ti/NiV/Ag front side metallization, may include the use of a lift-off resist. However, this may allow only for an overall metallization layer thickness of up to about 1 μm. For greater thicknesses it may be no longer possible to detach the resist from the wafer, and thus the wafer (or various metallization areas of the wafer) may be electrically shorted.

A conventional process for patterning a back side metallization, e.g. a Ti/NiV/Ag back side metallization, may include patterning the back side metallization together with the dicing of the wafer, in other words during the dicing (die singulation) process. For example, the metallization may be mechanically sawed together with the semiconductor material (e.g. silicon) of the wafer. Mechanical sawing may require a certain minimum width as sawing street and may cause damage to the chip (e.g. chipping).

Both the front side metallization patterning process and the back side metallization patterning process described above may require a limitation of the overall layer thickness to prevent electrical shorts on the front side and/or chipping on the back side, which may otherwise cause a decrease in the yield.

It may thus be desirable to provide a reliable method for patterning a back side and/or front side metallization layer or layer stack, which may, for example, avoid chip damage and/or may allow for overall metallization layer thicknesses of greater than 1 µm to be processed. Furthermore, it may be desirable to provide a method for patterning a metallization layer or layer stack that may enable the use of modern dicing methods such as plasma dicing or stealth dicing.

Various embodiments provide a method for patterning a metallization layer stack, for example a metallization layer stack including at least two different layers (e.g. containing or consisting of different materials), e.g. a metallization layer stack including at least three different layers, e.g. a layer stack including at least a titanium (Ti) layer, a nickel-vanadium (NiV) layer and a silver (Ag) layer, for example a back side metallization and/or a front side metallization including or consisting of the aforementioned layer stack. The method may be applied to a front side and/or back side of a semiconductor workpiece such as a wafer, e.g. a silicon wafer (wafers containing or consisting of other semiconductor materials than silicon, including IV-IV, III-V and II-VI compound semiconductor materials, for example germanium, silicon germanium, silicon carbide, gallium arsenide, gallium nitride, indium arsenide, indium gallium arsenide, or the like, may be possible as well).

In accordance with one or more embodiments, patterning the metallization layer stack may include or may be achieved by etching, for example wet chemical etching and/or dry chemical etching. This may allow for patterning also layer stacks that have an overall thickness of greater than or equal to about 1 µm, e.g. greater than or equal to about 2 µm, e.g. greater than or equal to about 3 µm, e.g. greater than or equal to about 4 µm, e.g. greater than or equal to about 5 µm, or even greater thicknesses. Etching the layer stack may include the use of a suitable etch mask material or etch mask system such as, for example, a positive or negative photoresist (e.g. spray resist), or a hardmask material such as, for example, a nitride (e.g. plasma nitride), an oxide (e.g. plasma oxide), a carbide, a metal or metal alloy, an adhesive film or tape, or the like.

In accordance with one or more embodiments, at least two different layers of a metallization layer stack may be wet chemically etched using an etching solution which has the same or at least substantially the same etching rate for the at least two different layers.

In accordance with one or more embodiments, a metallization layer stack including at least three different layers, e.g. a titanium (Ti) layer, a nickel-vanadium (NiV) layer and a silver (Ag) layer, that may have been deposited previously, e.g. by means of sputtering (sputter deposition), may be patterned using a combination of wet chemical and dry chemical processes. For example, in accordance with one or more embodiments, a first and a second layer (e.g. an Ag layer and a NiV layer) of the layer stack may be wet etched using an etching solution, which has the same, or at least substantially the same, etching rate for both layers (e.g. same etching rate for both Ag and NiV), while a third layer (e.g. Ti layer) of the layer stack may be dry etched.

The term "at least substantially the same etching rate" as used herein may, for example, be understood to include cases where a difference between the etching rate (of a given etching solution) for a first layer and the etching rate (of that etching solution) for a second layer may be less than or equal to about 5%, e.g. less than or equal to about 2%, e.g. less than or equal to about 1%, e.g. less than or equal to about 0.5%, e.g. less than or equal to about 0.1%, e.g. zero (i.e. exactly the same).

Alternatively, also the third layer (e.g. Ti layer) may be wet etched using, for example, an etching solution, which may be different from the etching solution used for etching the first and second layers (e.g. Ag layer and NiV layer) of the layer stack.

Etching solutions used for etching (e.g. simultaneously etching) an Ag layer and a NiV layer may, for example, include or be metal etching solutions such as used, for example, in Cu pattern etch metal etching.

In accordance with one or more embodiments, an etching solution used for etching the Ag layer and the NiV layer may contain about 50-60% (e.g. about 55%) $H_3PO_4$ (phosphoric acid), about 1.4-1.8% (e.g. about 1.6%) $HNO_3$ (nitric acid), about 21-25% (e.g. about 23%) HAc (acetic acid), and about 0.3-0.7% (e.g. about 0.5%) of a surfactant, e.g. an organic surfactant such as a modified alcohol or phenol. Alternatively the surfactant, e.g. organic surfactant, can be substituted by an organic acid, e.g. acetic acid, which may be present in the etching solution anyway in accordance with some embodiments.

In accordance with one or more embodiments, an etching solution used for etching the Ti layer may include or may be one or more of the following: dilute hydrofluoric acid (DHF), e.g. about 0.01% to about 1% (e.g. about 0.01% to about 0.5%, e.g. about 0.01%, e.g. about 0.05%, e.g. about 0.1%) hydrofluoric acid (HF), $COOHCOOH/H_2O$, $HF/H_2O_2/HNO_3$, $HF/HCl/H_2O$, HCl conc., KOH conc., NaOH conc., $H_2SO_4$ (e.g. about 20% $H_2SO_4$), $CCl_3COOC_2H_5$, HCOOH (e.g. about 25% HCOOH), $H_3PO_4$ (e.g. about 20% $H_3PO_4$).

In accordance with one or more embodiments, the resulting structure (patterned metal layer stack, with or without patterned mask) may be used as a mask for further processing, e.g. further patterning of a base material (e.g. of a wafer) such as, for example, semiconductor (e.g. silicon) or dielectric (e.g. oxide) etching, or dicing (e.g. plasma dicing or laser dicing). When for example used as a hard mask for plasma dicing, a damage-free singulation of chips may be achieved using the patterned metal back side described herein in accordance with one or more embodiments. An effect of this processing may be that equipment and media that have previously been used in production may be used for this processing as well.

Figure 1:
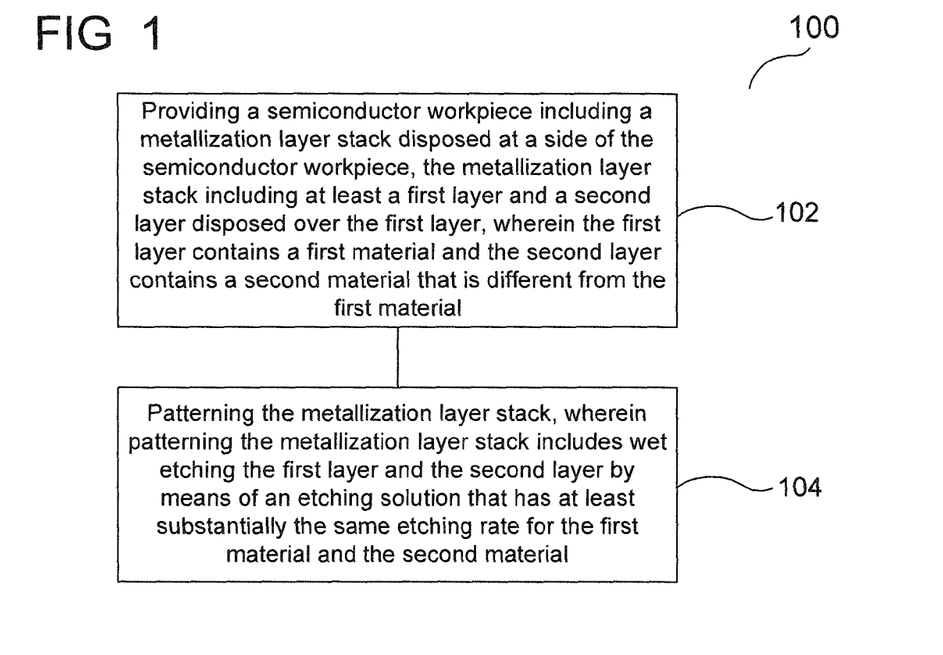
FIG. 1 shows a method for processing a semiconductor workpiece in accordance with various embodiments.

FIG. 1 shows a method 100 for processing a semiconductor workpiece in accordance with various embodiments.

Method 100 may include: providing a semiconductor workpiece including a metallization layer stack disposed at a side of the semiconductor workpiece, the metallization layer stack including at least a first layer and a second layer disposed over the first layer, wherein the first layer contains (e.g. consists of) a first material and the second layer contains (e.g. consist of) a second material that is different from the first material (in 102); and patterning the metallization layer stack, wherein patterning the metallization layer stack includes wet etching the first layer and the second layer by means of an etching solution that has at least substantially the same etching rate for the first material and the second material (in 104).

In accordance with one or more embodiments, the first material may contain (e.g. be) a first metal or metal alloy and the second layer may contain (e.g. be) a second metal or metal alloy that is different from the first metal or metal alloy.

In accordance with one or more embodiments, the first material may contain (e.g. be) an adhesion material. For example, the first layer may be configured as an adhesion layer or adhesion promoter. For example, the first metal or metal alloy may serve as the adhesion material or adhesion promoter. In accordance with one or more embodiments, the term "adhesion material or promoter" or "adhesion layer"

may include or may refer to a material or layer that may be configured to improve adhesion between two elements or layers.

In accordance with one or more embodiments, the first material may contain (e.g. be) nickel-vanadium (NiV). For example, the first metal or metal alloy may be NiV.

In accordance with one or more embodiments, the second material may contain (e.g. be) a solder material or solder interface material. For example, the second layer may be configured as a solder interface layer. For example, the second metal or metal alloy may serve as the solder material or solder interface material. In accordance with one or more embodiments, the term "solder material or solder interface material" or "solder interface layer" may include or may refer to a material or layer that may be configured to form a solder link or connection to another material or layer, in other words a material or layer that may form a connection to another material or layer by means of soldering the material or layer and/or the other material or layer.

In accordance with one or more embodiments, the second material may contain (e.g. be) silver (Ag). For example, the second metal or metal alloy may be Ag. In accordance with one or more embodiments, the second layer may include a first sublayer containing (e.g. consisting of) copper (Cu) and a second sublayer containing (e.g. consisting of) tin, wherein the first sublayer of the second layer may be disposed between the first layer (e.g. adhesion layer, e.g. NiV layer) of the metallization layer stack and the second sublayer.

In accordance with one or more embodiments, the semiconductor workpiece may include (e.g. may be) a wafer, for example a silicon wafer (wafers including or consisting of other semiconductor materials (including compound semiconductor materials), for example germanium, silicon germanium, silicon carbide, gallium arsenide, gallium nitride, indium arsenide, indium gallium arsenide, or the like, may be possible as well).

In accordance with one or more embodiments, the metallization layer stack may have been formed by means of at least one deposition process, e.g. at least one sputter deposition process or electrochemical or electroless deposition or vapor phase deposition process. For example, the metallization layer stack may include (e.g. consist of) a plurality of layers, wherein at least one (e.g. a plurality, e.g. all) of the layers may have been formed by means of one or more of the aforementioned deposition processes.

In accordance with one or more embodiments, the metallization layer stack may have been deposited over an entire surface or side of the wafer, e.g. over an entire back side of the wafer. In other words, the metallization layer stack may have been formed to cover the entire surface or side (e.g. back side) of the wafer.

In accordance with one or more embodiments, the metallization layer stack may be disposed at a back side of the wafer. For example, the metallization layer stack may include or may be configured as a back side metallization of the wafer.

In accordance with one or more embodiments, the semiconductor workpiece (e.g. the wafer, e.g. silicon wafer) may include a substrate region (e.g. silicon substrate region), wherein the metallization layer stack may be disposed over a back side (e.g. lower side) of the substrate region. In accordance with one or more embodiments, the substrate region may be disposed at or proximate a back side of the semiconductor workpiece (e.g. the wafer).

In accordance with one or more embodiments, the metallization layer stack may be disposed at a front side or active side of the wafer. For example, the metallization layer stack may include or may be configured as a front side metallization of the wafer.

In accordance with one or more embodiments, the semiconductor workpiece (e.g. wafer, e.g. silicon wafer) may include a device region or active region, wherein the metallization layer stack may be disposed over a front side (e.g. upper side) of the device region or active region. In accordance with one or more embodiments, the device region or active region may include one or more semiconductor elements, e.g. one or more integrated circuit elements, e.g. one or more active and/or passive elements such as, for example, one or more diodes, transistors, thyristors, capacitors, inductors, or the like. In accordance with one or more embodiments, the device region or active region may induce one or more interconnects, e.g. one or more vias and/or one or more electrically conductive lines.

In accordance with one or more embodiments, the device region may be disposed over the substrate region.

In accordance with one or more embodiments, the first material may contain (e.g. be) nickel-vanadium (NiV) and the second material may contain (e.g. be) silver (Ag), and the etching solution used for wet etching the first layer and the second layer may include (e.g. consist of) about 50-60% (e.g. about 55%) phosphoric acid, about 1.4-1.8% (e.g. about 1.6%) nitric acid, about 21-25% (e.g. about 23%) acetic acid, and about 0.3-0.7% (e.g. about 0.5%) of a surfactant.

In accordance with one or more embodiments, the metallization layer stack may further include a third layer containing (e.g. consisting of) a third material that is different from the first material and the second material, wherein the first layer may be disposed over the third layer, and wherein patterning the metallization layer stack may further include etching the third layer subsequent to wet etching the first layer and the second layer.

In accordance with one or more embodiments, the third material may contain (e.g. be) a third metal or metal alloy that is different from the first metal or metal alloy and different from the second metal or metal alloy.

In accordance with one or more embodiments, the third material may contain (e.g. be) a diffusion barrier material. For example, the third layer may be configured as a diffusion barrier layer. For example, the third metal or metal alloy may serve as the diffusion barrier material. In accordance with one or more embodiments, the term "diffusion barrier" may include or may refer to a material or layer that may be configured to prevent or at least substantially reduce diffusion of atoms or ions from a layer into another layer, for example diffusion of metal atoms or ions from the metallization layer stack into an underlying layer (e.g. a semiconductor layer of the wafer). In accordance with one or more embodiments, the third material may contain (e.g. be) an adhesion material. For example, the third layer may be configured as an adhesion layer. For example, the third metal or metal alloy may serve as the adhesion material.

In accordance with one or more embodiments, the third material may contain (e.g. be) at least one material selected from the following group of materials the group consisting of: titanium (Ti), tungsten (W), tantalum (Ta), TaN, Ta/TaN, WTi, and WTiN. For example, the third metal or metal alloy may be Ti, W, Ta, TaN, Ta/TaN, WTi, or WTiN.

In accordance with one or more embodiments, etching the third layer may include dry etching the third layer. In other words, etching the third layer may include or may be achieved by a dry etching process.

In accordance with one or more embodiments, dry etching the third layer may include plasma etching the third layer. In other words, dry etching the third layer may include or may be achieved by a plasma etch process.

In accordance with one or more embodiments, etching the third layer may include wet etching the third layer. In other words, etching the third layer may include or may be achieved by a wet etch process.

In accordance with one or more embodiments, wet etching the third layer may include using an etching solution that is different from the etching solution used for wet etching the first layer and the second layer.

In accordance with one or more embodiments, the etching solution used for wet etching the third layer may include (e.g. consist of) one of the following: hydrofluoric acid, e.g. dilute hydrofluoric acid (DHF), e.g. about 0.01% to about 1% (e.g. about 0.01% to about 0.5%, e.g. about 0.01%, e.g. about 0.05%, e.g. about 0.1%) hydrofluoric acid (HF), COOHCOOH/$H_2O$, HF/$H_2O_2$/$HNO_3$, HF/HCl/$H_2O$, HCl conc., KOH conc., NaOH conc., $H_2SO_4$ (e.g. about 20% $H_2SO_4$), $CCl_3COOC_2H_5$, HCOOH (e.g. about 25% HCOOH), $H_3PO_4$ (e.g. about 20% $H_3PO_4$).

In accordance with one or more embodiments, patterning the metallization layer stack may include forming a mask layer over the metallization layer stack and patterning the mask layer to form a patterned mask, before wet etching the first layer and the second layer of the metallization layer stack.

In accordance with one or more embodiments, the mask layer may contain (e.g. consist of) at least one of the following materials: a photoresist (e.g. negative or positive photoresist, e.g. spray resist), a hardmask material (e.g. a nitride (e.g. plasma nitride), an oxide (e.g. plasma oxide), a carbide, a metal or metal alloy, an adhesive film or tape, or the like).

In accordance with one or more embodiments, patterning the metallization layer stack may include exposing at least one portion of the wafer, e.g. at least one portion of the substrate region of the wafer.

In accordance with one or more embodiments, patterning the metallization layer stack may include exposing at least one kerf region of the wafer, wherein the method may further include: dicing the wafer along the at least one kerf region subsequent to patterning the metallization layer stack.

In accordance with one or more embodiments, dicing the wafer along the at least one kerf region may include plasma etching the at least one kerf region. In other words, dicing the wafer along the at least one kerf region may include or may be achieved by a plasma dicing process.

In accordance with one or more embodiments, dicing the wafer along the at least one kerf region may include irradiating the at least one kerf region with a laser. In other words, dicing the wafer along the at least one kerf region may include or may be achieved by a laser dicing process.

In accordance with one or more embodiments, one or more singulated chips or dies may be obtained by dicing the wafer. One or more, e.g. each, of the singulated chips or dies may include a portion of the patterned metallization layer stack.

In accordance with one or more embodiments, the metallization layer stack may have a thickness of greater than or equal to about 200 nm, e.g. greater than or equal to about 500 nm, e.g. greater than or equal to about 1 µm, e.g. greater than or equal to about 2 µm, e.g. greater than or equal to about 3 µm, e.g. greater than or equal to about 4 µm, e.g. greater than or equal to about 5 µm, e.g. in the range from about 200 nm to about 5 µm.

In accordance with one or more embodiments, the first layer (e.g. adhesion layer, e.g. NiV layer) may have a thickness in the range from about 20 nm to about 2 µm, e.g. in the range from about 50 nm to about 1 µm, e.g. in the range from about 100 nm to about 500 nm, e.g. in the range from about 100 nm to about 300 nm, e.g. about 200 nm.

In accordance with one or more embodiments, the second layer (e.g. solder interface layer, e.g. Ag layer) may have a thickness in the range from about 20 nm to about 4 µm, e.g. in the range from about 100 nm to about 4 µm, e.g. in the range from about 500 nm to about 4 µm, e.g. in the range from about 1 µm to about 4 µm, e.g. in the range from about 2 µm to about 4 µm, e.g. about 3 µm.

In accordance with one or more embodiments, the third layer (e.g. diffusion barrier layer, e.g. Ti layer) may have a thickness in the range from about 20 nm to about 2 µm, e.g. in the range from about 50 nm to about 1 µm, e.g. in the range from about 100 nm to about 500 nm, e.g. in the range from about 200 nm to about 400 nm, e.g. about 300 nm.

In accordance with one or more embodiments, the first layer may contain (e.g. consist of) NiV and may have a thickness of about 200 nm, the second layer may contain (e.g. consist of) Ag and may have a thickness of about 3 µm, and the third layer may contain (e.g. consist of) Ti and may have a thickness of about 300 nm.

In accordance with one or more embodiments, the metallization layer stack may further include a fourth layer containing (e.g. consisting of) a fourth material that may be different from the first material, the second material and the third material, wherein the third layer may be disposed over the fourth layer, and wherein patterning the metallization layer stack may further include etching (e.g. wet etching or dry etching) the fourth layer subsequent to etching the third layer.

In accordance with one or more embodiments, the fourth material may contain (e.g. be) a fourth metal or metal alloy that may be different from the first metal or metal alloy, different from the second metal or metal alloy and different from the third metal or metal alloy.

In accordance with one or more embodiments, the fourth layer may contain (e.g. be) a contact material, e.g. ohmic contact material. For example, the fourth layer may be configured as a contact layer, e.g. ohmic contact layer. For example, the fourth metal or metal alloy may serve as the contact material, e.g. ohmic contact material. In accordance with one or more embodiments, the term "contact material" or "contact layer", e.g. "ohmic contact material or ohmic contact layer", may include a material or layer that may be configured to improve electrical contact (e.g. reduce a contact resistance) to a layer or material, e.g. a semiconductor layer (e.g. silicon layer), of the semiconductor workpiece (e.g. wafer), e.g. to a semiconductor layer of a device region or active region at the front side of a wafer, or to a semiconductor layer of a substrate region at the back side of a wafer.

In accordance with one or more embodiments, the fourth material may contain (e.g. be) aluminum (Al) or an aluminum alloy, or titanium (Ti).

In accordance with one or more embodiments, the fourth layer (e.g. contact layer, e.g. Al layer) may have a thickness in the range from about 100 nm to about 2 µm, e.g. in the range from about 100 nm to about 1 µm, e.g. in the range from about 100 nm to about 500 nm, e.g. in the range from about 200 nm to about 400 nm, e.g. about 300 nm.

Figure 2:
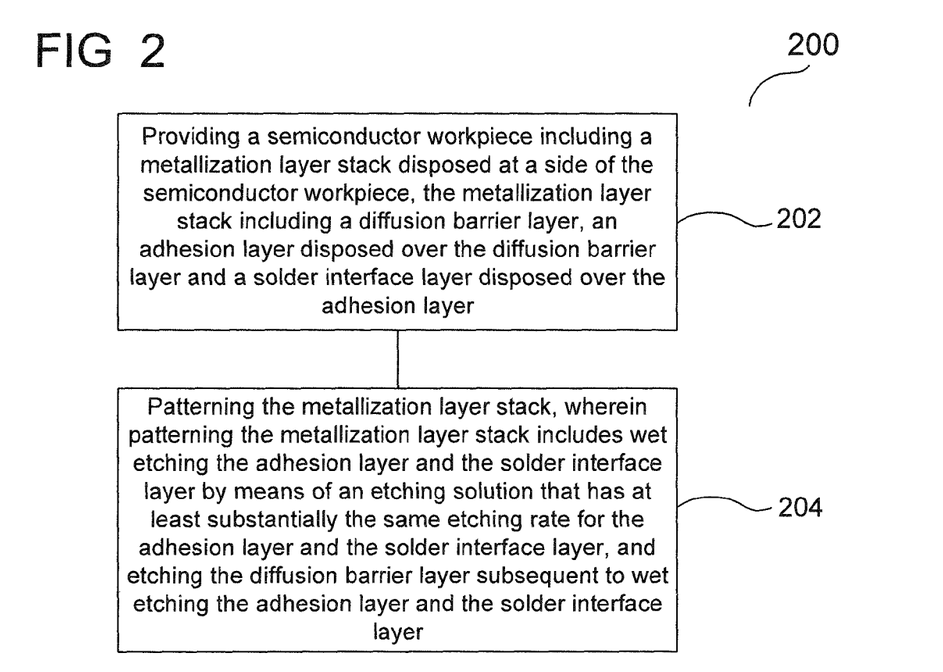
FIG. 2 shows a method for processing a semiconductor workpiece in accordance with various embodiments.

FIG. 2 shows a method 200 for processing a semiconductor workpiece in accordance with various embodiments.

Method 200 may include: providing a semiconductor workpiece including a metallization layer stack, the metallization layer stack including a diffusion barrier layer, an adhesion layer disposed over the diffusion barrier layer and a solder interface layer disposed over the adhesion layer (in 202); patterning the metallization layer stack, wherein patterning the metallization layer stack includes wet etching the adhesion layer and the solder interface layer by means of an etching solution that has at least substantially the same etching rate for the adhesion layer and the solder interface layer, and etching the diffusion barrier layer subsequent to wet etching the adhesion layer and the solder interface layer (in 204).

In accordance with one or more embodiments, the adhesion layer may contain (e.g. consist of) nickel-vanadium (NiV) and the solder interface layer may contain (e.g. consists of) silver (Ag), wherein the etching solution may contain about 50-60% (e.g. about 55%) phosphoric acid, about 1.4-1.8% (e.g. about 1.6%) nitric acid, about 21-25% (e.g. about 23%) acetic acid, and about 0.3-0.7% (e.g. about 0.5%) of a surfactant (e.g. an organic surfactant such as a modified alcohol or phenol. Alternatively, the surfactant, e.g. organic surfactant, can be substituted by an organic acid, e.g. acetic acid, which may be present in the etching solution anyway in accordance with some embodiments.)

In accordance with one or more embodiments, the diffusion barrier layer may contain (e.g. consist of) titanium (Ti).

In accordance with one or more embodiments, etching the diffusion barrier layer may include dry etching (e.g. plasma etching) the diffusion barrier layer.

Method 200 may further be configured in accordance with one or more embodiments described herein.

Figure 3:
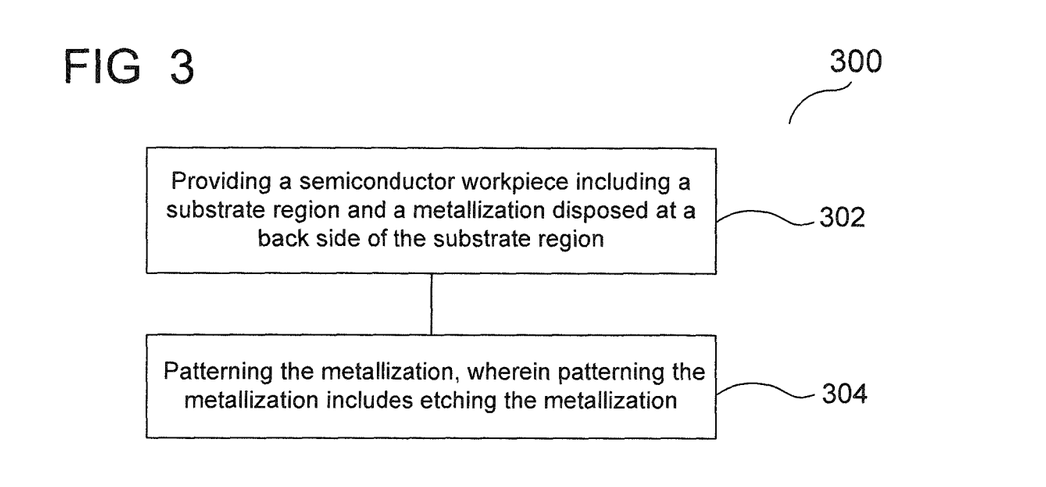
FIG. 3 shows a method for processing a semiconductor workpiece in accordance with various embodiments.

FIG. 3 shows a method 300 for processing a semiconductor substrate in accordance with various embodiments.

Method 300 may include: providing a semiconductor workpiece including a substrate region and a metallization disposed at a back side of the substrate region (in 302); patterning the metallization, wherein patterning the metallization includes etching the metallization (in 304).

In accordance with one or more embodiments, the metallization may have a thickness of greater than or equal to about 1 μm, e.g. greater than or equal to about 2 μm, e.g. greater than or equal to about 3 μm, e.g. greater than or equal to about 4 μm, e.g. greater than or equal to about 5 μm.

In accordance with one or more embodiments, etching the metallization may include wet etching at least a portion of the metallization, for example an upper portion of the metallization.

In accordance with one or more embodiments, etching the metallization may include wet etching the entire thickness of the metallization.

In accordance with an embodiment, etching the metallization may include wet etching at least two layers of the metallization using the same etching solution. The etching solution may have the same etching rate for the at least two layers.

In accordance with one or more embodiments, etching the metallization may include dry etching (e.g. plasma etching) at least a portion of the metallization.

In accordance with one or more embodiments, etching the metallization may include wet etching a first portion of the metallization, and dry etching a second portion of the metallization disposed below the first portion of the metallization, subsequent to wet etching the first portion of the metallization.

In accordance with one or more embodiments, the metallization may include (e.g. consist of) a metallization layer stack including (e.g. consisting of) a diffusion barrier layer, an adhesion layer disposed over the diffusion barrier layer, and a solder interface layer disposed over the adhesion layer, wherein etching the metallization may include wet etching the adhesion layer and the solder interface layer and dry etching the diffusion barrier layer.

In accordance with one or more embodiments, the diffusion barrier layer may contain (e.g. consist of) titanium (Ti), the adhesion layer may contain (e.g. consist of) nickel-vanadium (NiV), and the solder interface layer may contain (e.g. consist of) at least one of silver (Ag) and gold-tin (AuSn).

In accordance with one or more embodiments, the semiconductor workpiece may include or may be a wafer, wherein patterning the metallization may include exposing at least one kerf region of the wafer, wherein method 300 may further include: dicing the wafer along the at least one kerf region subsequent to patterning the metallization.

In accordance with one or more embodiments, dicing the wafer may include at least one of a plasma dicing process and a laser dicing process.

Method 300 may further be configured in accordance with one or more embodiments described herein.

In the following, a process sequence for patterning a metallization layer stack in accordance with one or more embodiments will be described with reference to FIG. 4A to 4D.

Figure 4A:
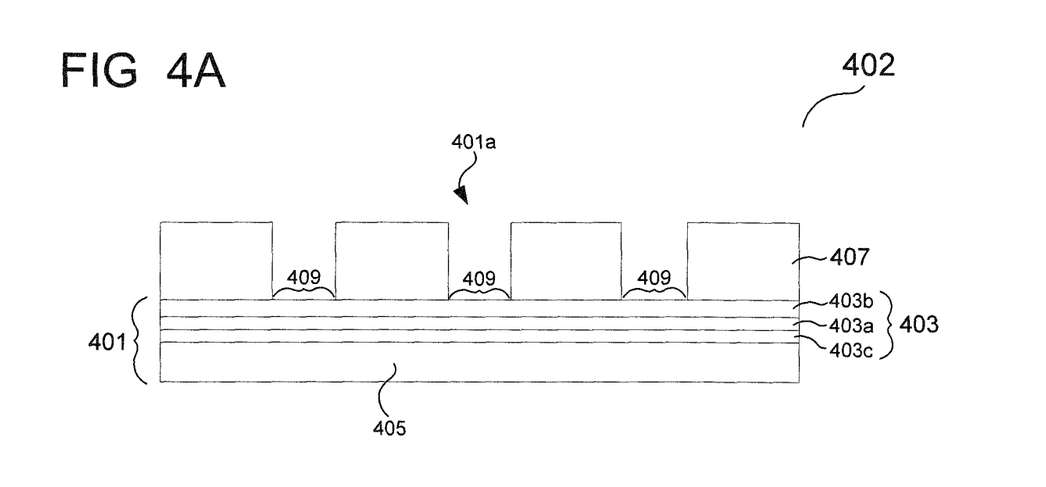
FIG. 4A to FIG. 4D show various views illustrating a process sequence for patterning a metallization layer stack in accordance with one or more embodiments.

As shown in FIG. 4A in a view 402, a semiconductor workpiece 401 may be provided. The semiconductor workpiece 401 may include a wafer 405, e.g. a silicon wafer, and a metallization layer stack 403 disposed at a side 401a of the semiconductor workpiece 401. In accordance with one or more embodiments, side 401a may correspond to a back side of the wafer 405 and/or the semiconductor workpiece 401. In accordance with other embodiments, side 401a may correspond to a front side or active side of the wafer 405 and/or the semiconductor workpiece 401.

The metallization layer stack 403 may have been deposited over the wafer 405, for example by means of at least one deposition process, e.g. at least one sputter deposition process. The metallization layer stack 403 may include a first layer 403a, a second layer 403b disposed over the first layer 403a, and a third layer 403c disposed between the wafer 405 and the first layer 403a.

The first layer 403a may be configured as an adhesion layer of the metallization layer stack 403. The first layer 403a may be a nickel-vanadium (NiV) layer. The first layer 403a may have a thickness in accordance with one or more embodiments described herein, e.g. about 200 nm as an example.

The second layer 403b may be configured as a solder interface layer of the metallization layer stack 403. The second layer 403b may be a silver (Ag) layer. The second layer 403b may have a thickness in accordance with one or more embodiments described herein, e.g. about 3 μm as an example.

The third layer 403c may be configured as a diffusion barrier layer of the metallization layer stack 403. The third layer 403c may be a titanium (Ti) layer. The third layer 403c may have a thickness in accordance with one or more embodiments described herein, e.g. about 300 nm as an example.

In accordance with one or more embodiments, the wafer 405 may include a substrate region, wherein the metallization layer stack 403 may be disposed over a back side of the substrate region.

As shown in FIG. 4A, the metallization layer stack 403 disposed over the wafer 405 may be coated with a suitable mask material or mask layer 407, which may subsequently be patterned e.g. by means of a standard technology (e.g. standard lithography technology). Possible mask systems may be resists, adhesive tapes or other hardmask systems (e.g. plasma oxides, plasma nitrides, or the like). The mask layer 407 may be formed over the second layer 403b of the metallization layer stack 403. Patterning the mask layer 407 may result in one or more portions or areas 409 of the outermost layer of the metallization layer stack 403, i.e. the second layer 403b (Ag layer) in the example shown, being exposed. In accordance with one or more embodiments, locations of the exposed portions or areas 409 may correspond to locations of one or more kerf regions 415 of the wafer 405 (see FIG. 4D).

Figure 4B:
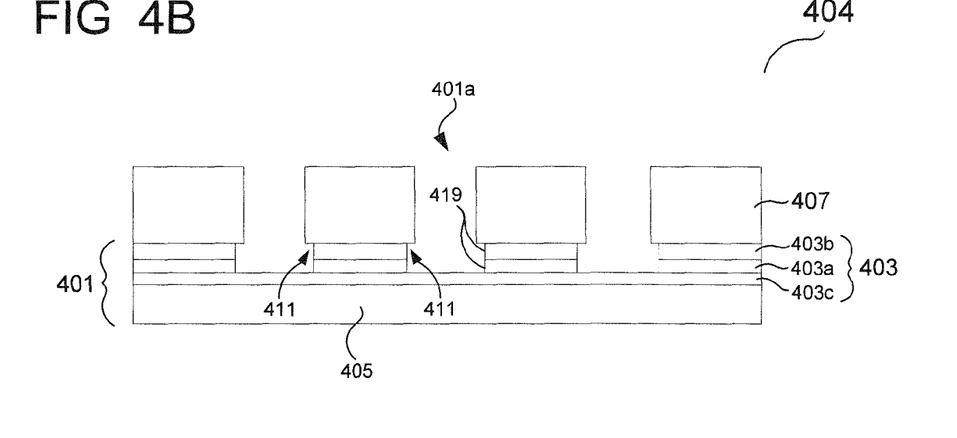

As shown in FIG. 4B in a view 404, the one or more areas 409 of the second layer 403b (Ag layer) not covered by the mask layer 407 may be wet chemically etched. By suitable choice of the etching time, silver (Ag) of the second layer 403b and nickel-vanadium (NiV) of the first layer 403a in the open areas (in other words, areas exposed by the patterned mask layer 407) may be removed in a single etching step, using e.g. an etching solution that has at least substantially the same etching rate for both Ag and NiV, for example an etching solution containing about 50-60% (e.g. about 55%) $H_3PO_4$, about 1.4-1.8% (e.g. about 1.6%) $HNO_3$, about 21-25% (e.g. about 23%) HAc, and about 0.3-0.7% (e.g. about 0.5%) of a surfactant such as e.g. octylphenoxypolyethoxyethanol. A resolution that may be achieved may, for example, be defined by the mask 407 used for the etching, the metal layer thicknesses (e.g. thickness of the first layer 403a and second layer 403b) and an undercut 411 (lateral etching of the Ag layer 403b under the mask 407).

As shown in FIG. 4B, edges 419 of the etched first and second layers 403a, 403b may be at least substantially flush. In other words, an etch front may be at least substantially homogeneous. In still other words, while there may be a certain undercut 411 of the layer stack 403's second layer (Ag layer) 403b and first layer (NiV layer) 403b with respect to the mask layer 407, it may be possible that there is no or substantially no undercut of the first layer (NiV layer) 403a with respect to the second layer (Ag layer) 403b, or vice versa. This may be an effect of simultaneously etching the second layer (Ag layer) 403b and the first layer (NiV layer) 403a using an etching solution that has at least substantially the same etching rate for the materials of both layers, i.e. for both Ag and NiV.

Figure 4C:
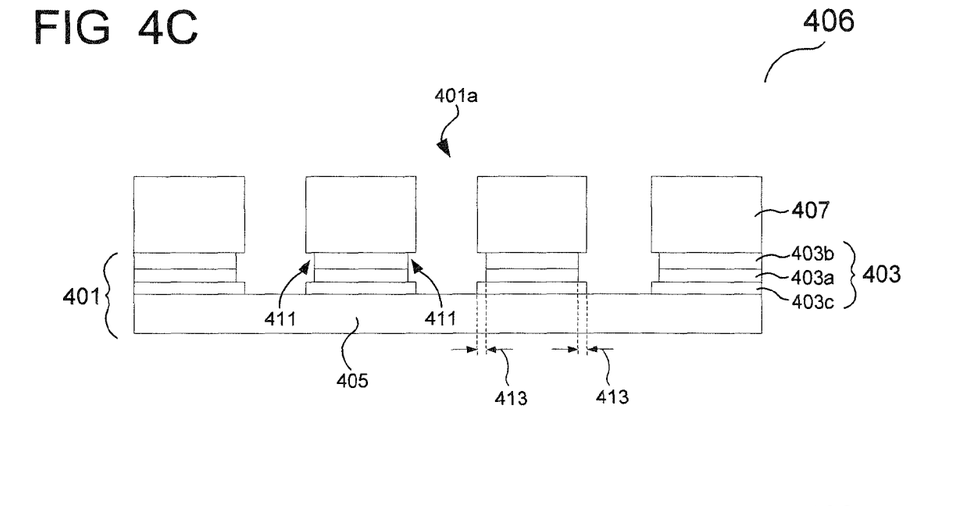

As shown in FIG. 4C in a view 406, material (i.e. Ti in this example) of the third layer 403c of the metallization layer stack 403 may subsequently be removed by means of a dry etching process (e.g. plasma etch process) without underetching, using the same mask 407 as used previously for the etching of the Ag layer 403b and the NiV layer 403a.

An effect of the aforementioned method may be that formation of an etch front is reproducible. Silver (Ag) (of the second layer 403b) and nickel-vanadium (NiV) (of the first layer 403a) may be somewhat retreated compared to titanium (Ti) (of the third layer 403c), as indicated in FIG. 4C by arrows 413. For example, in accordance with one or more embodiments a distance indicated by arrows 413 may be in the range from about 50 nm to about 500 nm, for example in the range from about 100 nm to about 300 nm, for example about 200 nm, although other values of the distance 413 may be possible as well. The distance 413 may depend, for example, on the thickness of the layer(s) to be etched. Thus, a barrier function of the Ti (of the third layer 403c) may be preserved as NiV (of the first layer 403a) and Ag (of the second layer 403b) may not be able to form a direct contact to the base material (e.g. silicon) of the wafer 405.

Alternatively, a purely wet chemical processing may be applied, depending e.g. on the diffusion barrier requirements. In this case the wet chemical patterning of Ag (of the second layer 403b) and NiV (of the first layer 403a) may be followed by a wet chemical etching of the third layer (Ti layer) 403c with e.g. very slight underetching under the first layer (NiV layer) 403a, depending on the etching time. In accordance with one or more embodiments, wet chemical etching of the third layer 403c may include using a different etching solution than was used for etching the first and second layers 403a, 403b, for example an etching solution that is selective to the material of the third layer 403c. In an example, wet etching the third layer 403c may be performed using an etching solution that contains dilute hydrofluoric acid (DHF), e.g. about 0.01% to about 1% (e.g. about 0.01% to about 0.5%, e.g. about 0.01%, e.g. about 0.05%, e.g. about 0.1%) hydrofluoric acid (HF).

An effect of a purely wet chemical processing may be reduced process costs compared to processing, which includes dry etching (e.g. plasma etching).

Figure 4D:
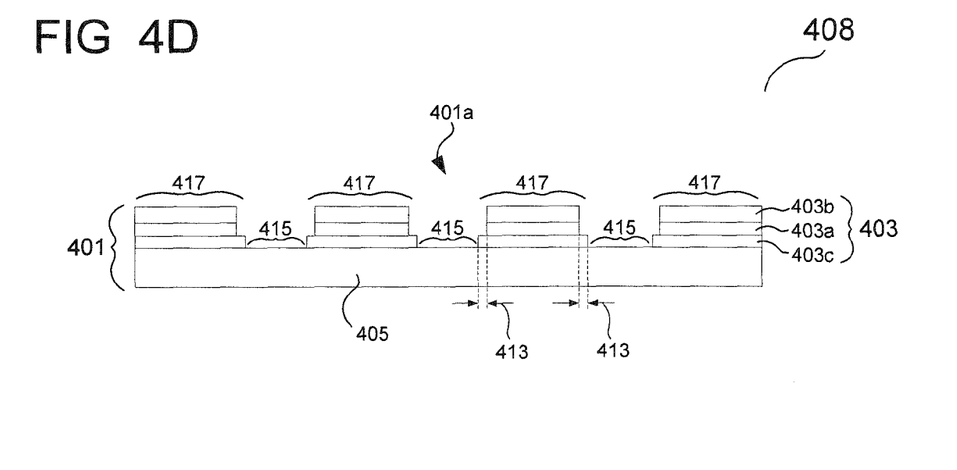

As shown in FIG. 4D in a view 408, the patterned mask layer 407 may be removed subsequent to etching the third layer 403c of the metallization layer stack 403, for example using a standard resist stripping process or the like. Alternatively, the patterned mask layer 407 may remain over the metallization layer stack 403, e.g. during one or more additional processing steps, e.g. during semiconductor and/or dielectric etching of the wafer 405 or during a wafer dicing process.

As shown in FIG. 4D, the semiconductor workpiece 401 may include a patterned metallization layer stack 403, wherein patterning the metallization layer stack 403 may have been achieved by a combination of wet chemical and dry chemical etching processes or, alternatively, by purely wet chemical etching. For example, at least two layers of the stack 403, e.g. first and second layers 403a, 403b in the example shown, may have been etched simultaneously using wet chemical etching, while a third layer 403c of the stack 403 may have been etched using dry chemical etching (e.g. plasma etching) or wet chemical etching. The simultaneous wet etching of the first and second layers 403a, 403b may result in an etch front that shows no or substantially no underetching of the first layer 403a relative to the second layer 403b. A subsequent dry etching of the third layer 403c may result in an overall etch front, in which one or more edges of the third layer 403c may protrude from corresponding edges of the first and/or second layer 403a, 403b by some distance 413, as shown in FIG. 4D.

In accordance with one or more embodiments, one or more areas or portions 415 of the wafer 405 disposed laterally between portions 417 of the patterned metallization layer stack 403 may include or be one or more kerf regions of the wafer 405, and the wafer 405 may, for example, be diced along the one or more kerf regions in subsequent processing, which may result in one or more singulated chips or dies, wherein each chip or die may include a portion 417 of the patterned metallization layer stack 403.

Various embodiments described herein provide a method for reliably patterning a metallization, e.g. a metallization layer stack, e.g. a Ti/NiV/Ag layer stack, e.g. on a wafer back side and/or on a wafer front side, by means of a wet chemical patterning process.

In accordance with one or more embodiments, at least two layers of a metallization layer stack, e.g. an Ag layer and a NiV layer, may be etched using the same etch chemistry. The etch chemistry, e.g. etch solution, may be selected such that the etching rate is at least substantially the same for the at least two layers. In other words, all layers of the at least two layers may be etched with at least substantially the same etching rate. This may, for example, have the effect that an etch front may be homogeneous and/or that an underetch of one layer of the at least two layers with respect to another layer of the at least two layers may be prevented or at least substantially reduced.

A method for processing a semiconductor workpiece in accordance with various embodiments may include: providing a semiconductor workpiece including a metallization layer stack disposed at a side of the semiconductor workpiece, the metallization layer stack including at least a first layer and a second layer disposed over the first layer, wherein the second layer contains a different material than the first layer; patterning the metallization layer stack, wherein patterning the metallization layer stack includes wet etching the first layer and the second layer by means of an etching solution that has at least substantially the same etching rate for the first layer and the second layer.

A method for processing a semiconductor workpiece in accordance with various embodiments may include: providing a semiconductor workpiece including a metallization layer stack disposed at a side of the semiconductor workpiece, the metallization layer stack including at least a first layer and a second layer disposed over the first layer, wherein the first layer contains a first material, and wherein the second layer contains a second material that is different from the first material; patterning the metallization layer stack, wherein patterning the metallization layer stack includes wet etching the first layer and the second layer using the same etching solution, wherein the etching solution has substantially the same etching rate for the first material and the second material.

A method for processing a semiconductor workpiece in accordance with various embodiments may include: providing a semiconductor workpiece; depositing a metallization layer stack over a side of the semiconductor workpiece, wherein the metallization layer stack includes at least a first layer and a second layer disposed over the first layer, the first layer containing a first material and the second layer containing a second material different from the first material; patterning the metallization layer stack, wherein patterning the metallization layer stack includes wet etching the first layer and the second layer using the same etching solution, wherein the etching solution has substantially the same etching rate for the first material and the second material.

A method for processing a semiconductor workpiece in accordance with various embodiments may include: providing a semiconductor workpiece; depositing a first metallization layer over a side of the semiconductor workpiece, the first metallization layer containing a first material; depositing a second metallization layer over the first metallization layer, the second metallization layer containing a second material different from the first material; patterning the metallization layer stack, wherein patterning the metallization layer stack includes wet etching the first layer and the second layer using the same etching solution, wherein the etching solution has substantially the same etching rate for the first material and the second material.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for processing a semiconductor workpiece, the method comprising:
providing a semiconductor workpiece comprising a metallization layer stack disposed at a side of the semiconductor workpiece, the metallization layer stack comprising at least a first layer and a second layer disposed over the first layer, wherein the first layer comprises a first material and the second layer comprises a second material that is different from the first material;
patterning the metallization layer stack, wherein patterning the metallization layer stack comprises wet etching the first layer and the second layer by means of an etching solution that has at least substantially the same etching rate for the first material and the second material.

2. The method of claim 1, wherein the first material comprises a first metal or metal alloy and the second material comprises a second metal or metal alloy that is different from the first metal or metal alloy.

3. The method of claim 1, wherein at least one of the first material and the second material is configured as at least one of an adhesion material, a bather material and a solder material.

4. The method of claim 1, wherein the first material comprises nickel-vanadium, and wherein the second material comprises silver.

5. The method of claim 4, wherein the first material comprises nickel-vanadium and the second material comprises silver, and wherein the etching solution used for wet etching the first layer and the second layer comprises about 50-60 % phosphoric acid, about 1.4-1.8% nitric acid, about 21-25% acetic acid, and about 0.3-0.7% of a surfactant.

6. The method of claim 1, wherein the semiconductor workpiece comprises a wafer.

7. The method of claim 6, wherein the metallization layer stack is disposed at a back side of the wafer.

8. The method of claim 6, wherein the metallization layer stack is disposed at a front side of the wafer.

9. The method of claim 6, wherein patterning the metallization layer stack comprises exposing a kerf region of the wafer, the method further comprising: dicing the wafer along the kerf region subsequent to patterning the metallization layer stack.

10. The method of claim 9, wherein dicing the wafer along the kerf region comprises plasma etching the kerf region.

11. The method of claim 9, wherein dicing the wafer along the kerf region comprises irradiating the kerf region with a laser.

12. The method of claim 1, wherein the metallization layer stack further comprises a third layer comprising a third material that is different from the first material and the second material, wherein the first layer is disposed over the third layer, and wherein patterning the metallization layer stack further comprises etching the third layer subsequent to wet etching the first layer and the second layer.

13. The method of claim 12, wherein the third material comprises a diffusion barrier material or adhesion material.

14. The method of claim 12, wherein the third material comprises titanium.

15. The method of claim 12, wherein etching the third layer comprises dry etching the third layer.

16. The method of claim 15, wherein dry etching the third layer comprises plasma etching the third layer.

17. The method of claim 12, wherein etching the third layer comprises wet etching the third layer using an etching solution that is different from the etching solution used for wet etching the first layer and the second layer.

18. The method of claim 17, wherein the etching solution used for wet etching the third layer comprises hydrofluoric acid.

19. The method of claim 1, wherein patterning the metallization layer stack comprises forming a mask layer over the metallization layer stack and patterning the mask layer to form a patterned mask, before wet etching the first layer and the second layer of the metallization layer stack.

20. A method for processing a semiconductor workpiece, the method comprising:
- providing a semiconductor workpiece comprising a metallization layer stack disposed at a side of the semiconductor workpiece, the metallization layer stack comprising a diffusion barrier layer, an adhesion layer disposed over the diffusion barrier layer and a solder interface layer disposed over the adhesion layer;
- patterning the metallization layer stack, wherein patterning the metallization layer stack comprises wet etching the adhesion layer and the solder interface layer by means of an etching solution that has at least substantially the same etching rate for the adhesion layer and the solder interface layer, and etching the diffusion barrier layer subsequent to wet etching the adhesion layer and the solder interface layer.

21. The method of claim 20, wherein the adhesion layer comprises nickel-vanadium and the solder interface layer comprises silver, and
- wherein the etching solution comprises about 50-60% phosphoric acid, about 1.4-1.8% nitric acid, about 21-25% acetic acid, and about 0.3-0.7% of a surfactant.

22. The method of claim 20, wherein etching the diffusion barrier layer comprises dry etching the diffusion barrier layer.

23. A method for processing a semiconductor workpiece, the method comprising:
- providing a semiconductor workpiece comprising a substrate region and a metallization disposed at a back side of the substrate region;
- patterning the metallization, wherein patterning the metallization comprises etching the metallization,
- wherein the metallization comprises a metallization layer stack comprising a diffusion barrier layer, an adhesion layer disposed over the diffusion barrier layer, and a solder interface layer disposed over the adhesion layer, and
- wherein etching the metallization comprises wet etching the adhesion layer and the solder interface layer and dry etching the diffusion barrier layer.

24. The method of claim 23, wherein the metallization comprises a thickness of greater than or equal to about 200 nm.

25. The method of claim 23, wherein the diffusion barrier layer comprises titanium, the adhesion layer comprises nickel-vanadium, and the solder interface layer comprises silver.

26. The method of claim 23, wherein the semiconductor workpiece comprises a wafer, wherein patterning the metallization comprises exposing a kerf region of the wafer, the method further comprising: dicing the wafer along the kerf region subsequent to patterning the metallization.

* * * * *

UNITED STATES PATENT AND TRADEMARK OFFICE
CERTIFICATE OF CORRECTION

PATENT NO.       : 9,093,385 B2
APPLICATION NO.  : 13/903013
DATED            : July 28, 2015
INVENTOR(S)      : Gissibl et al.

Page 1 of 1

It is certified that error appears in the above-identified patent and that said Letters Patent is hereby corrected as shown below:

In the Claims:

Claim 3, column 14, line 14: delete "a bather material" and write --a barrier material-- in place thereof.

Signed and Sealed this
Twenty-first Day of June, 2016

Michelle K. Lee
*Director of the United States Patent and Trademark Office*